United States Patent [19]

Shamouilian et al.

[11] Patent Number: 5,486,975
[45] Date of Patent: Jan. 23, 1996

[54] CORROSION RESISTANT ELECTROSTATIC CHUCK

[75] Inventors: Shamouil Shamouilian, San Jose; Yoshi Tanase, Campbell, both of Calif.

[73] Assignee: Applied Materials, Inc., Santa Clara, Calif.

[21] Appl. No.: 189,811

[22] Filed: Jan. 31, 1994

[51] Int. Cl.⁶ .................................................. H02N 13/00
[52] U.S. Cl. ......................................... 361/234; 361/230
[58] Field of Search ................................. 361/230, 234; 269/8, 903; 279/128

[56] References Cited

U.S. PATENT DOCUMENTS

| | | | |
|---|---|---|---|
| 4,184,188 | 1/1980 | Briglia | 361/234 |
| 4,384,918 | 5/1983 | Abe . | |
| 4,399,016 | 8/1983 | Tsukada et al. . | |
| 4,645,218 | 2/1987 | Ooshio et al. | 361/234 |
| 4,771,730 | 9/1988 | Tezuka . | |
| 5,345,999 | 9/1994 | Hosokawa | 165/80.2 |

FOREIGN PATENT DOCUMENTS

| | | |
|---|---|---|
| 1-298721 | 12/1989 | Japan . |
| 2-227748 | 1/1990 | Japan . |

OTHER PUBLICATIONS

Klein, Allen J., "Curing Techniques for Composites," *Advanced Composites*, Mar./Apr. 1988, pp. 32–44.

"Data Sheet–Breathers and Bleeders," Data Sheet from Airtech International, Inc., Carson, Calif. (1993).

"Kapton General Information," Technical Brochure from DuPont de Nemours Company, Wilmington, Del. (1993).

"R/flex® 1100 High Temperature Materials," Data Sheet DS20903D, Rogers Corporation, Chandler, Ariz. (1993).

*Primary Examiner*—Jeffrey A. Gaffin
*Attorney, Agent, or Firm*—Ashok K. Janah

[57] ABSTRACT

A corrosion resistant electrostatic chuck 10 for holding a silicon wafer 18 during processing with a corrosive gas has an electrically insulative layer 12 thereon protected from corrosion by a guard 14. The insulative layer 12 has a top surface 20 covered by the silicon wafer 18 and an exposed side surface 16. The guard 14 substantially encloses the exposed side surface 16 of the insulative layer 12 and protects the insulative layer 12 from a corrosive gas. The guard 14 is made of sacrificial material that corrodes at least as fast as the insulative layer 12 corrodes when exposed to the corrosive gas. The sacrificial material positioned near the exposed side surface 16 corrodes and reduces the concentration of the corrosive gas at the exposed side surface 16, thereby reducing the rate of corrosion of the insulative layer 12.

24 Claims, 1 Drawing Sheet

5,486,975

CORROSION RESISTANT ELECTROSTATIC CHUCK

BACKGROUND

This invention relates to an electrostatic chuck for holding semiconductor substrates during processing with corrosive gases, the chuck having improved corrosion resistance.

In the semiconductor industry, electrostatic chucks use electrostatic attraction forces to hold substrates, such as silicon wafers during processing. Electrostatic chucks are described in more detail in for example, U.S. Pat. No. 4,184,188 to Briglia; U.S. Pat. No. 4,399,016 to Tokuda; and U.S. Pat. No. 4,384,918, to Abe.

A typical electrostatic chuck comprises a pedestal having an electrode thereon covered by an electrically insulative layer. A voltage source is provided for electrically biasing the electrode so that electric charge can accumulate in the electrode and in the insulator. The accumulated electric charge generates an electrostatic force F that attracts and holds the substrate against the insulative layer. The force F is given by:

$$F = \frac{1}{2} \epsilon \frac{V^2}{t^2} A$$

where $\epsilon$ is the dielectric constant of the insulative layer, V is the applied voltage, t is the thickness of the insulative layer, and A is the area of the conductive pedestal that serves as the electrode. Thus, to obtain a strong electrostatic attractive force, it is desirable to have a thin insulative layer which has a high dielectric constant $\epsilon$.

Typically, polyimides and other organic polymers are used as the insulative layer because of their high voltage breakdown strength and their superior chemical resistance. Also, the ability of the polyamide to conform to the backside of the substrate allows for good heat transfer for cooling the substrate during processing. However, polyimides and other organic polymers corrode rapidly when exposed to corrosive gases such as oxygen, chlorine, and fluorine used in processing of the silicon wafers.

During such processing with corrosive gases, a top surface of the insulative layer is substantially covered by the silicon wafer and protected from corrosion. However, the thin, side surfaces of the insulative layer are exposed to the corrosive gases and quickly corrode. After a short operation cycle, the thin insulative layer can be sufficiently corroded to allow the flow of electrons therethrough, causing arcing and malfunctioning of the chuck.

Protective coatings have been applied to the insulative layer in an attempt to slow the corrosion. However, these coatings can be expensive to manufacture and are not effective against all types of corrosive gases. Thus, there is a need for an electrostatic chuck having an insulative layer which is not quickly corroded by corrosive gases, thereby increasing the useful life of the electrostatic chuck.

SUMMARY

A corrosion-resistant electrostatic chuck according to the present invention satisfies this need. The electrostatic chuck comprises an electrically insulative layer and a guard for protecting the insulative layer from the corrosive gas. The insulative layer has a top surface and an exposed side surface, and the guard substantially encloses the exposed side surface of the insulative layer.

The guard is made from a sacrificial material that corrodes at least as quickly as the insulative layer corrodes when exposed to a corrosive gas. For example, if the insulative layer is a polyimide, the sacrificial material can also be a polyimide. As described below, when the chuck is exposed to a corrosive gas, the sacrificial material positioned proximate to the exposed side surface of the insulative layer corrodes to reduce the concentration of corrosive gas at the side surface of the insulative layer, thereby reducing the rate of corrosion of the insulative layer. Therefore, the guard is effective no matter what corrosive gas is utilized during the processing of the wafer.

Typically, the substrate held by the chuck is positioned on the top surface of the insulative layer, and thus only the side surface of the insulative layer is exposed. However, the guard can also enclose any portion of the top surface not covered by the substrate. Optimally, the guard also encloses a side surface of the substrate to further protect the insulative layer from corrosion.

An advantage of the present invention is that the guard can be quickly and easily replaced to allow for further processing of the substrate in a corrosive environment.

DRAWINGS

These and other features, aspects, and advantages of the present invention will become better understood with regard to the following description, appended claims, and accompanying drawings, where:

DESCRIPTION

Figure 1:
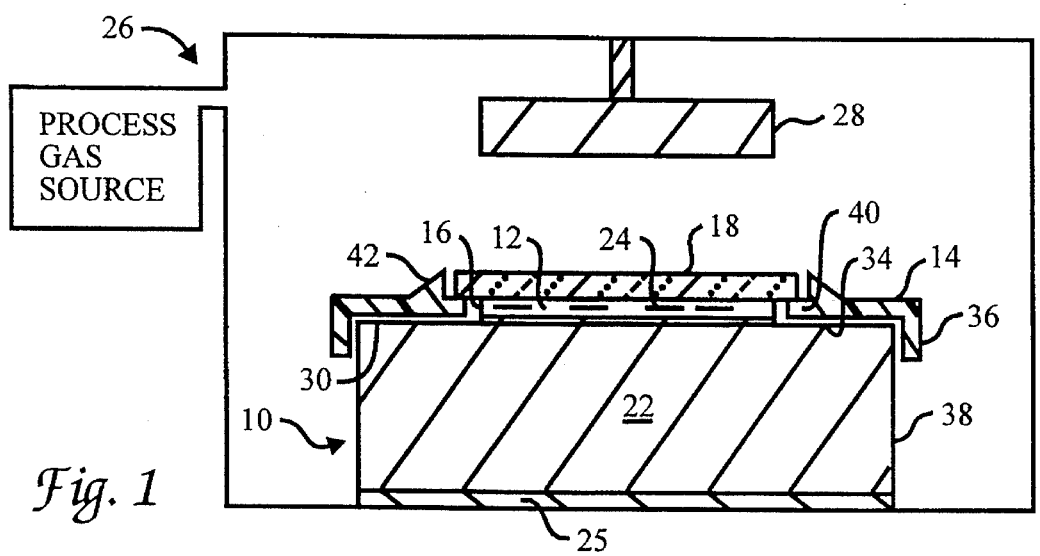
FIG. 1 is a cutaway side elevation view of an electrostatic chuck of the present invention positioned in a processing chamber, the chuck having a protective guard.

With reference to the Figures, an apparatus according to the present invention comprises (i) an electrostatic chuck 10 having an electrically insulative layer 12 thereon, and (ii) a guard 14 which substantially encloses a side surface 16 of the insulative layer 12. The electrostatic chuck 10 holds a substrate, typically a silicon wafer 18, against a top surface 20 of the insulative layer 12.

The design of the electrostatic chuck 10 varies according to the particular application. For example, the electrostatic chuck 10 can comprise a non-conductive pedestal 22 having an electrode 24 thereon covered by the insulative layer 12. More typically, the pedestal 22 of the chuck 10 is electrically conductive and the electrode 24 is embedded in the insulative layer 12.

As shown in FIG. 1, the electrostatic chuck 10 is placed on a cathode 25 in a processing chamber 26 for processing the wafer 18 with corrosive gases. An anode 28 is positioned above the wafer 18. The anode 28 acts as an electrical ground that completes the DC circuit of the electrostatic chuck via a plasma formed in the process chamber 26 by electrically biasing the cathode 25 with respect to the anode 28.

The electrode 24 is made from any electrically conductive material, such as for example, copper, nickel, chromium, aluminum, iron, and mixtures or alloys thereof. The electrode 24 preferably has a thickness from about 1 μm to 1000

μm, more preferably from about 10 μm to 100 μm, and most preferably about 25 μm.

The insulative layer 12 is positioned between the electrode 24 and the wafer 18 and prevents the flow of electrons between the electrode 24 and the wafer 18. Optimally, the shape and size of the insulative layer 12 corresponds to the shape and size of the silicon wafer 18 to provide a good heat transfer path to cool the wafer 18 during processing, and to limit exposure of the insulative layer 12 to corrosive gases. Preferably, the wafer 18 covers and protects the top surface 20 of the insulative layer 12 from corrosion so only the side surface 16 is exposed. Alternatively, the insulative layer 12 can have a shape different from the shape of the silicon wafer 18 and/or a size different from the size of the silicon wafer 18.

Typically, the dielectric constant of the insulative layer 12 is at least about 2, and more preferably at least about 3. The optimal thickness of the insulative layer 12 decreases as the dielectric constant of the insulative layer 12 increases. For example, an insulative layer that has a dielectric constant of about 3.5, has a thickness from about 1 μm to about 100 μm, and more preferably from about 25 to about 100 μm. Preferably, the insulative layer 12 is resistant to temperatures in excess of 100° C., and more preferably resistant to temperatures in excess of 200° C., in order to use the chuck 10 for processes where the wafer 18 is heated. The height of the side surface 16, corresponds with the thickness of the insulative layer 12.

Suitable materials for the insulative layer 12 include polyimides, polyketones, polyetherketones, polysulfones, polycarbonates, polystyrenes, nylons, polyvinylchlorides, polypropylenes, polyetherketones, polyethersulfones, polyethylene terephthalate, fluoroethylene propylene copolymers, cellulose, triacetates, silicone, and rubber. Manufactured polymer layers 12 that are suitable for use in the present invention include for example, "KAPTON" a polyimide film manufactured by DuPont de Nemours Co., in Wilmington, Del.; "APIQUEO" fabricated by Kanegafuchi Chemical Indus., Japan; "UPILEX" manufactured by Ube Indus. Ltd., Japan; "NITOMID" fabricated by Nitto Electric Indus. Co. Ltd., Japan; and "SUPERIOR FILM" fabricated by Mitsubishi Plastics Indus. Ltd., Japan. A suitable process for fabricating a chuck with an insulative layer thereon is disclosed in copending U.S. patent application Ser. No. 08/189,562, entitled "ELECTROSTATIC CHUCK" by Shamouilian, et al, filed on Jan. 31, 1994 - which is incorporated herein by this reference.

The insulative layer 12 can also include filler materials for increasing the thermal conductivity and/or resistance to corrosion. Fillers such as diamond, alumina, zirconium boride, boron nitride and aluminum nitride are preferred because these materials have high thermal conductivity, good insulative properties and can withstand high temperatures. Preferably the filler material is a powder with an average particle size of less than about 10 μm, and preferably, the filler is dispersed in the polymer film in a volumetric ratio from about 10% to 80%, and more typically from about 20% to 50%.

Additionally, a protective coating (not shown) can be applied on the insulative layer 12 to further protect the insulative layer 12 from chemical degradation when the chuck 10 is used in corrosive processing environments. Preferred protective coatings and processes for their fabrication are described in more detail in for example copending U.S. patent application Ser. No. 08/052,018, filed on Feb. 22, 1993, entitled "PROTECTIVE COATING FOR DIELECTRIC MATERIAL ON WAFER SUPPORT USED IN INTEGRATED CIRCUIT PROCESSING APPARATUS AND METHOD OF FORMING THE SAME," by Wu et al., which is incorporated herein by this reference.

Figure 3:
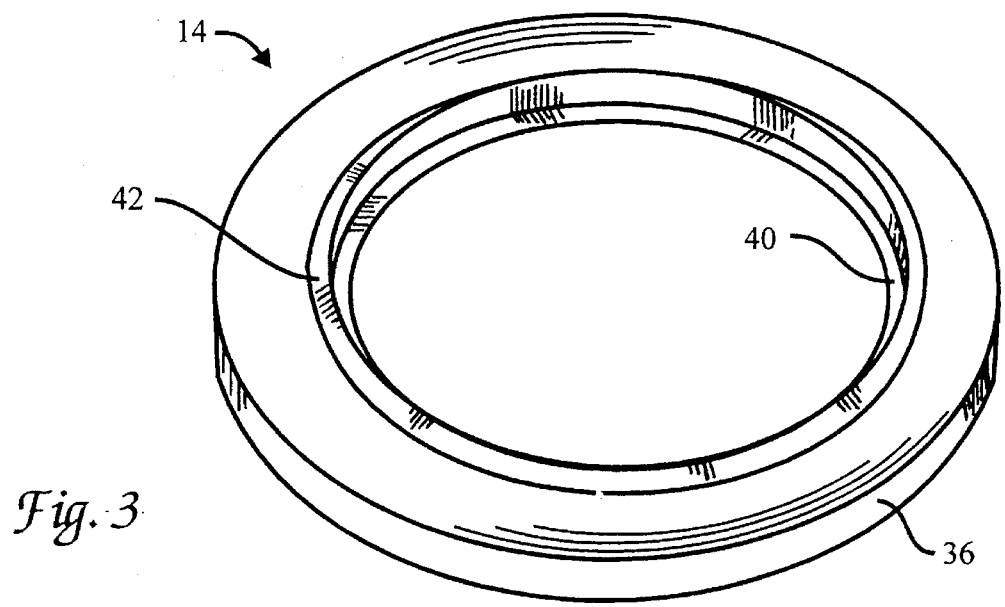
FIG. 3 is a perspective view of the guard of FIG. 1.

The guard 14 is sized and shaped to substantially enclose the side surface 16 of the insulative layer 12. Preferably, the guard 14 also substantially encloses a side surface 31 of the wafer 18 without touching the side surface 31 of the wafer 18, to provide better corrosion protection for the insulative layer 12 while allowing the wafer 18 to be processed on its side surface 31 by the corrosive gas. As shown in FIG. 3, when the insulative layer 12 has a circular cross-section, the guard 14 has an annular body portion and sized to fit around the insulative layer 12. The guard 14 has a bottom surface 34 which conforms to and is positioned on the upper surface 30 of the pedestal 22. The guard 14 is sized to extend above the insulative layer 12, and optimally above the wafer 18, when the guard 14 is positioned on the pedestal 22. The guard 14 can have an outer, downwardly extending lip 36 which fits around an outer surface 38 of the chuck 10 to hold the guard 14 in position.

As shown in FIG. 1, the diameter of the insulative layer 12 can be less than the diameter of the wafer 18, and the top surface 20 of the insulative layer 12 is protected by the silicon wafer 18. The guard 14 can have an extension 40 which extends between the overlap portion of the wafer 18 and the pedestal 22 to enclose the side surface 16 of the insulative layer 12 Further, the guard 14 can have a wedge-shaped ring portion 42 extending above the inner lip 40 to further protect the side surface 6 of the insulative layer 12.

Figure 2:
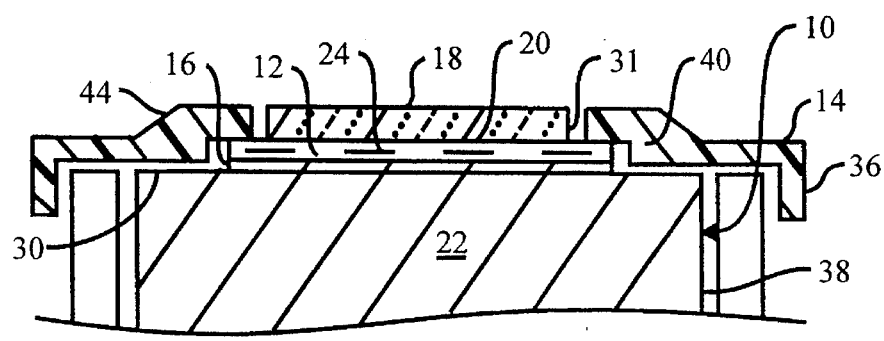
FIG. 2 is a partial cutaway side elevation view of a second version of an electrostatic chuck according to the present invention.

As shown in FIG. 2, the top surface 20 of the insulative layer 12 may not be completely covered by the wafer 18. To protect the exposed portion of the top surface 20, the guard 14 can have an upper lip 44 extending above the exposed portion of the top surface 20 to substantially enclose the top surface 20.

The guard 14 is made of a sacrificial material that corrodes at least as quickly as the insulative layer 12 when exposed to a corrosive gas. Thus, the guard 14 can be formed of exactly the same material used for the insulative layer 12. Optimally, the sacrificial material corrodes faster than the insulative layer 12 when exposed to corrosive gas to provide better protection to the insulative layer 12. Thus, the type of sacrificial material varies according to the type of material utilized in the insulative layer 12. For example, if the insulative layer 12 is made of polyimide, the sacrificial material can be made of polyimide, or alternatively polyamide which corrodes faster than polyimide when exposed to oxygen plasma. When the insulator 12 is made of silicon oxide, the guard 14 can be made from silicon oxide. When the insulative layer 12 comprises polyimide, a suitable polyimide material for the guard 14 is manufactured under the tradename "VESPEL" commercially available from DuPont de Nemours Chemical Co., Wilmington, Del. The guard 14 can also comprise fiber reinforcement, or inorganic fillers such as alumina or silica. Thus, the guard 14 effectively reduces the rate of corrosion of the insulative layer 12 regardless of which corrosive gas is utilized in the process. Moreover, the guard 14 can easily be replaced after it becomes excessively corroded.

The concept is to provide a sacrificial material proximate to the exposed side surface 16 of the insulative layer 12 which corrodes at least as fast as insulative layer 12 to reduce the concentration of corrosive gas at the side surface 16 of insulative layer 12. Thus, it is not necessary for the guard 14 to seal around the side surface 16 of the insulative layer 12. However, the guard 14 should be located proximate to the insulative layer 12 to provide optimum protection.

The guard 14 is made by injection molding the sacrificial material and machining the guard 14 to the desired size and shape. The guard 14 can also be machined from cut sections of a polyimide tube. Alternatively, other known manufacturing methods can be utilized.

In operation, the wafer 18 is placed on the insulative layer 12, an electrical voltage is applied to the electrode 24 and a plasma is created in the chamber to hold the wafer 18 against the top surface 20 of the insulative layer 12. The guard 4 rests on the upper surface 30 of the pedestal 22 and encloses the side surface 16 of the insulative layer 12. Corrosive gas is released into the processing chamber 26 to process the wafer 18. The wafer 8 protects the top surface 20 of the insulative layer 12 from corrosion, while the guard 14 corrodes to reduce the concentration of corrosive gas near the side surface 16 of the insulative layer 12, thereby reducing the rate of corrosion of the insulative layer 12. Upon completing the processing, the wafer 18 is removed from the chuck 10.

Although the present invention has been described in considerable detail with regard to the preferred version thereof, other versions are possible. For example, the wafer 18 and the insulative layer 12 could have a rectangular cross-section, and the guard 14 could be correspondingly shaped to enclose the insulative layer 12. Therefore, the appended claims should not be limited to the description of the preferred versions contained herein.

What is claimed is:

1. A corrosion resistant apparatus for holding a substrate during processing with a corrosive gas, the apparatus comprising:
   (a) an electrostatic chuck having an electrically insulative layer, the insulative layer having a top surface and an exposed side surface, the chuck being chargeable for holding the substrate thereon by electrostatic force; and
   (b) a guard substantially enclosing the exposed side surface of the insulative layer for protecting the insulative layer against the corrosive gas, the guard being made from a sacrificial material that corrodes at least as quickly as the insulative layer corrodes when exposed to the corrosive gas.

2. The apparatus of claim 1, wherein the sacrificial material corrodes faster than the insulative layer corrodes when exposed to the corrosive gas.

3. The apparatus of claim 1, wherein a substrate is positioned on the top surface of the insulative layer, and the guard also substantially encloses any portion of the top surface of the insulative layer not covered by the substrate.

4. The apparatus of claim 1, wherein the insulative layer is made of polyimide and the sacrificial material is made of polyimide.

5. The apparatus of claim 1, wherein the insulative layer has a horizontal cross-section which is circular and the guard is annular.

6. The apparatus of claim 5, wherein the guard has a bottom surface conformed to and positioned on an upper surface of the chuck, and the height of the guard is at least equal to the thickness of the insulative layer.

7. The apparatus of claim 1, wherein at least an overlap portion of the substrate extends horizontally beyond the insulative layer, and wherein the guard comprises an extension extending below the overlap portion of the substrate.

8. The apparatus of claim 1, wherein the guard does not contact the insulative layer.

9. The apparatus of claim 1, wherein a substrate is positioned on the top surface of the insulative layer, and the guard also substantially encloses a side surface of the substrate.

10. The apparatus of claim 9, wherein the guard does not contact the side surface of the substrate.

11. The apparatus of claim 1, wherein the guard includes a lip extending downwardly for holding the guard on the chuck.

12. The apparatus of claim 1, wherein the insulative layer is selected from the group consisting of polyimides, polyketones, polyetherketones, polysulfones, polycarbonates, polystyrenes, nylons, polyvinylchlorides, polypropylenes, polyetherketones, polyethersulfones, polyethylene terephthalate, fluoroethylene propylene copolymers, cellulose, triacetates, silicone and rubber.

13. The apparatus of claim 1, wherein the electrostatic chuck further comprises an electrode, and wherein the insulative layer covers the entire electrode.

14. A device useful for etching substrates, the device comprising:
   (a) a processing chamber;
   (b) a corrosion resistant apparatus for holding a substrate in the processing chamber during processing with a corrosive gas, the apparatus comprising (i) an electrostatic chuck including an electrically insulative layer, the insulative layer having a top surface and an exposed side surface, and (ii) a guard substantially enclosing the exposed side surface of the insulative layer for protecting the insulative layer against the corrosive gas, the guard being made from a sacrificial material that corrodes at least as quickly as the insulative layer corrodes when exposed to the corrosive gas; and
   (c) means for introducing the corrosive gas into the processing chamber.

15. A corrosion resistant apparatus for holding a substrate during processing with a corrosive gas, the apparatus comprising:
   (a) an electrostatic chuck having an electrically insulative layer thereon, the insulative layer having a top surface and an exposed side surface, the chuck being circular in a horizontal cross-section; and
   (b) a hollow, cylindrically shaped guard substantially enclosing the exposed side surface of the insulative layer for protecting the insulative layer against the corrosive gas, the guard being made from a sacrificial material that corrodes at least as quickly as the insulative layer corrodes when exposed to the corrosive gas, the guard having a bottom surface conformed to and positioned on an upper surface of the chuck.

16. The apparatus of claim 15, wherein the sacrificial material corrodes faster than the insulative layer corrodes when exposed to the corrosive gas.

17. The apparatus of claim 15, wherein a substrate is positioned on the top surface of the insulative layer, and the guard also substantially encloses any portion of the top surface of the insulative layer not covered by the substrate.

18. The apparatus of claim 15, wherein the insulative layer is made of polyimide and the sacrificial material is made of polyimide.

19. The apparatus of claim 15, wherein the guard does not contact the insulative layer.

20. The apparatus of claim 15, wherein a substrate having a horizontal cross-section which is circular is positioned on the top surface of the insulative layer and the guard also substantially encloses a side surface of the substrate.

21. The apparatus of claim 20, wherein the guard does not contact the side surface of the substrate.

22. The apparatus of claim 15, wherein the electrostatic chuck further comprises an electrode, and wherein the insulative layer cover the entire electrode.

23. A guard for reducing the rate of corrosion of an electrically insulative layer of an electrostatic chuck, the chuck being used for holding a substrate on a cathode during processing of the substrate with a corrosive gas, the electrically insulative layer of the chuck having a top surface upon which the substrate is placed and an exposed side surface, the guard comprising, (a) an annular body portion for placement on a top surface of the cathode; and (b) a ring portion extending upwardly from the body for protecting the exposed side surface of the insulative layer;

wherein the guard is made from a material which corrodes at least as fast as the insulative layer corrodes when exposed to the corrosive gas.

24. The guard of claim 23, wherein at least an overlap portion of the substrate extends horizontally beyond the insulative layer, and wherein the body of the guard comprises an extension extending below the overlap portion of the substrate.

* * * * *